(12) United States Patent
Moon et al.

(10) Patent No.: US 7,494,766 B2
(45) Date of Patent: Feb. 24, 2009

(54) METHOD OF MANUFACTURING LIQUID CRYSTAL DISPLAY DEVICE

(75) Inventors: Hong Man Moon, Gumi-si (KR); Su Woong Lee, Gumi-si (KR); Sang Yoon Paik, Seoul (KR)

(73) Assignee: LG. Display Co., Ltd., Seoul (KR)

( * ) Notice: Subject to any disclaimer, the term of this patent is extended or adjusted under 35 U.S.C. 154(b) by 488 days.

(21) Appl. No.: 11/172,069

(22) Filed: Jun. 30, 2005

(65) Prior Publication Data
US 2006/0088790 A1   Apr. 27, 2006

(30) Foreign Application Priority Data
Oct. 26, 2004   (KR) .................. 10-2004-0085646

(51) Int. Cl.
G03F 7/22   (2006.01)
(52) U.S. Cl. .................. 430/319; 430/321; 430/394
(58) Field of Classification Search .................. None
See application file for complete search history.

(56) References Cited

U.S. PATENT DOCUMENTS 5,795,686 A * 8/1998 Takizawa et al. .......... 430/5
5,945,256 A * 8/1999 Kim et al. .......... 430/312
2005/0024622 A1 * 2/2005 Kim .......... 355/75

FOREIGN PATENT DOCUMENTS

CN   1500227   5/2004
JP   2000-066235   3/2000

OTHER PUBLICATIONS

Computer-generated translation of JP 2000-066235, with abstracts (Mar. 2000).*
First Office Action for corresonding Chinese Patent Application Serial No. 200510080275.1, dated Aug. 3, 20007.

* cited by examiner

Primary Examiner—John A. McPherson
(74) Attorney, Agent, or Firm—Brinks Hofer Gilson & Lione

(57) ABSTRACT

A method of manufacturing a liquid crystal display device is provided. The method of manufacturing a liquid crystal display device includes performing an overlapping partitioned exposure process in one or two processes selected from a mask process of forming a gate line, a mask process of forming an active layer, a mask process of forming a source/drain electrode and a mask process of forming a contact hole on a passivation layer.

6 Claims, 5 Drawing Sheets

(a)

(b)

METHOD OF MANUFACTURING LIQUID CRYSTAL DISPLAY DEVICE

This application claims the benefit of priority to Korean Patent Application No. 85646/2004 file on Oct. 26, 2004, herein incorporated by Reference.

BACKGROUND

1. Field of the Invention

The invention relates to a method of manufacturing a liquid crystal display device, and in particular, a method of manufacturing a liquid crystal display device having reduced stitch spots.

2. Description of the Related Art

A cathode ray tube (CRT) has been widely used as an information display device. The CRT has many drawbacks such as a large size and low mobility. A liquid crystal display device has advantages of a compact size, a lightweight and low power consumption. Recently, the liquid crystal display device is frequently used with information processing apparatus requiring a display device.

The liquid crystal display device is a display device using modulation of light generated by a liquid crystal cell. A predetermined molecule arrangement of a liquid crystal is converted to other molecule arrangement by applying a voltage to the liquid crystal cell. The light is emitted through the converted molecule arrangement. The liquid crystal display device displays images by converting optical characteristics of the liquid crystal cell such as birefringence, an optimal rotary power, a dichroism and a light scattering character to visual variations.

The liquid crystal display device is manufactured by forming a gate line, a data line and a TFT on an array plate. Color filter layers such as R, G and B color filters are formed on a color filter plate and the color filter plate is aligned on a glass plate to face the array plate. The array plate and the glass plate are attached to each other with the liquid crystal interposed therebetween.

The array plate and the color filter plate are formed by sequentially performing a mask process. In the mask process, an insulating layer or a metal layer is deposited on an entire surface of the glass plate with a chemical vapor deposition (CVD) or a sputtering method. After depositing, a surface of the depositing layer formed on the plate is cleaned and a photo resist layer is coated. After coating, a target pattern is formed by using an exposure process and a developing process using a mask.

The depositing layer is etched by using the patterned photo resist layer to form a target pattern and the pattern photo resist layer is eliminated. By eliminating the pattern photo resist layer, a single mask process is completed.

FIGS. 1(a) and 1(b) illustrate an exposure method used in a manufacturing method of a liquid crystal display device according to a related art. As shown in FIG. 1(a), four active array plates are formed on a single glass plate. Four active areas corresponding to the four liquid crystal panels are formed simultaneously on the glass plate. After forming the four active areas, a cell process is performed for cutting the glass plate in a unit of a single active area.

The process forming the four active areas on the glass plate includes a first mask process of forming a gate line and a gate electrode on each of the four active areas, a second mask process of forming a channel layer, a third mask process of forming a source/drain electrode, a fourth mask process of forming a contact hole on a passivation layer, and a fifth mask process of forming a pixel electrode.

An exposure process is performed in each mask process. When the first mask process is performed, a metal layer is deposited on the glass plate and a photo-resist layer is coated on the metal layer. After coating, the exposure process is performed according to a mask pattern. The exposure process is performed four times on each active area sequentially.

In the exposure process, a single active area may be completely exposed with one time exposure process. As shown in FIG. 1(b), one or two active areas are formed on a glass plate in case of a large liquid crystal display device. In this case, a mask process is progressed by performing a plurality of exposure processes on each active area. The plurality of exposure processes is performed when each mask process is performed for forming an active area.

Manufacturing cost may increases in proportion to a size of an exposing lens. Although a size of a liquid crystal display device is small, a partitioned exposure process is performed to reduce the manufacturing cost. The size of the exposing lens may be reduced with the partitioned exposure process. The number of partitioned exposing areas may be 2, 3 or 4.

As described above, the partitioned exposure process completes a single mask process by performing a plurality of partitioned exposures on a single active area. On the other hand, a concentrated exposure process completes the single mask process by exposing an entire active area with one time exposure. The partitioned exposure process and the concentrated exposure process are selectively used in the manufacturing process of the liquid crystal display device. The partitioned exposure process may include one exposure process that generates overlapped exposing areas and the other exposure process that does not generate the overlapped exposing areas.

FIG. 2 shows overlapped exposing areas when an overlapping partitioned exposure process is performed. The overlapping partitioned exposure process produces overlapping exposing areas. As shown in FIG. 2, the overlapping partitioned exposure process performs a first exposure process to expose an active area within a predetermined width from a left edge of an active area formed on a glass plate. By the first exposure, a first exposing area is formed on the active area. After performing the first exposure, a second exposure is performed on an adjacent active area to form a second exposing area. When the second exposure is in progress, an overlapped exposing area is formed at the boundary area between the first exposing area and the second exposing area. Two exposing areas are illustrated in FIG. 2, but three or more exposing areas are possible. A size of a partitioned exposing area may increase with the overlapped area.

The overlapping partitioned exposure process is performed for forming a pixel electrode during a liquid crystal display device manufacturing process. The overlapping partitioned exposure process generates overlapped exposing areas, which may be used to secure a pattern margin.

FIG. 3 shows a exposing method for use with a liquid crystal display device manufacturing process according to a related art. As shown in FIG. 3, a partitioned exposure process is performed to manufacture a liquid crystal display device. The partitioned exposure process does not produce overlapping exposing areas.

Three partitioned exposures are performed for a liquid crystal panel in a first mask process of forming a gate line. A first exposure, a second exposure and a third exposure are orderly performed from a left edge of an active area for exposing an entire active area. After completing the partitioned exposure process, the gate line is formed by developing and patterning a photo resistor and performing an etching process.

After forming the gate line according to the first mask process as described above, three partitioned exposures are performed with a second mask process. The second mask process is performed with a developing process and an etching process for forming an active layer. After forming the active layer, a third mask process of forming a data line and a source/drain layer and a fourth mask process of forming a contact hole on a passivation layer are performed according to the partitioned exposure process. After completing the fourth mask process of forming a contact hole on the passivation layer, a fifth mask process is performed to form a pixel electrode by depositing an indium tin oxide (ITO) transparent metal layer. A pixel layer is formed by the fifth mask process.

In the fifth mask process of forming the pixel electrode, four partitioned exposures are performed. The overlapping partitioned exposure process (LEGO Pattern) is performed to generate an overlapped exposing area at the boundary between neighboring partitioned areas to obtain a pattern margin.

As described above, the partitioned exposure process is performed during the first to fourth mask processes. The overlapping partitioned exposure process is performed in the fifth mask process to generate an overlapped exposing area.

The overlapping partitioned exposure process is performed only in the mask process of forming the pixel electrode and is not performed in other mask processes. An overlayer change (pattern difference) is generated between a pattern of a pixel electrode formed on a layer where the overlapping partitioned exposure process is performed and a pattern formed on a layer where the overlapping partitioned exposure process in not performed. A stitch spot inferiority may be generated due to the pattern difference. Since the partitioned exposures are performed in the first, second, third and fourth mask processes and the overlapping partitioned exposures are performed in the fifth mask process, a large pattern variation may develop between a pattern formed on the first layer to the fourth layer and a pattern formed on the fifth layer. Accordingly, there is a need of a method of manufacturing a liquid crystal display device that substantially obviates drawbacks of the related art.

SUMMARY OF THE INVENTION

By way of introduction only, a method of manufacturing a liquid crystal display device includes performing an overlapping partitioned exposure process in one or two processes selected from a mask process of forming a gate line, a mask process of forming an active layer, a mask process of forming a source/drain electrode and a mask process of forming a contact hole on a passivation layer.

In other embodiment, a method of manufacturing a liquid crystal display device further includes performing an overlapping partitioned exposure process in at least three or more of a mask process of forming a gate line, a mask process of forming an active layer, a mask process of forming a source/drain electrode, a mask process of forming a contact hole on a passivation layer and a mask process of forming a pixel electrode.

In another embodiment, a method of manufacturing a liquid crystal display device includes performing an overlapping partitioned exposure (LEGO) by dividing an exposing area to N partitioned exposing areas in a mask process of forming a gate line; performing a partitioned exposure for M exposing areas in a mask process of depositing an active layer material on the gate line formed plate; performing an overlapping partitioned exposure by dividing an exposing area to N partitioned exposing areas in a mask process of forming a source/drain electrode after depositing a metal layer on the active layer formed plate; progressing a partitioned exposure in M exposing areas in a mask process of depositing a passivation layer after forming the source/drain electrode and forming a contact hole in the passivation layer; and progressing an overlapping partitioned exposure by dividing an exposing area to N partitioned exposing areas in a mask process of forming a pixel electrode on the contact hole formed passivation layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments, examples of which are illustrated in the accompanying drawings. Wherever possible, the same reference numbers will be used throughout the drawings to refer to the same or like parts.

Figure 1:
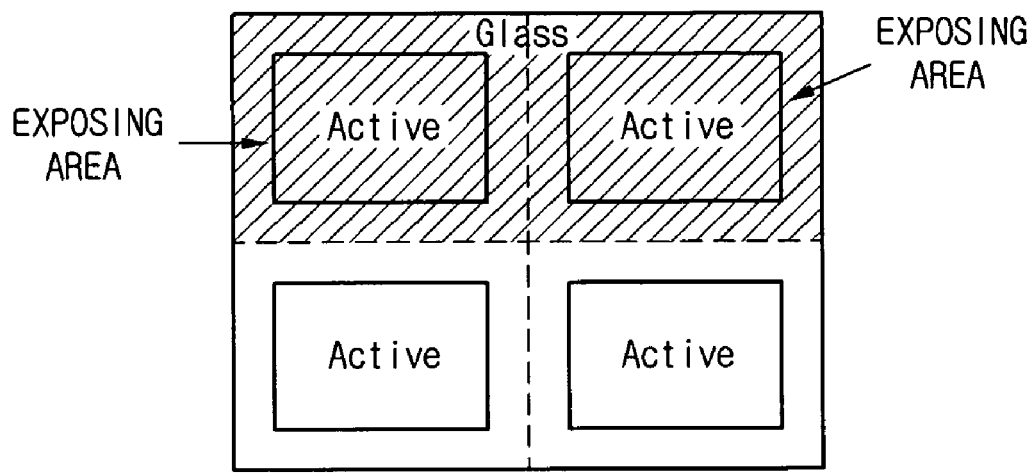
FIGS. 1(a) and 1(b) illustrate an exposure method used in a manufacturing method of a liquid crystal display device according to a related art.
Figure 1:
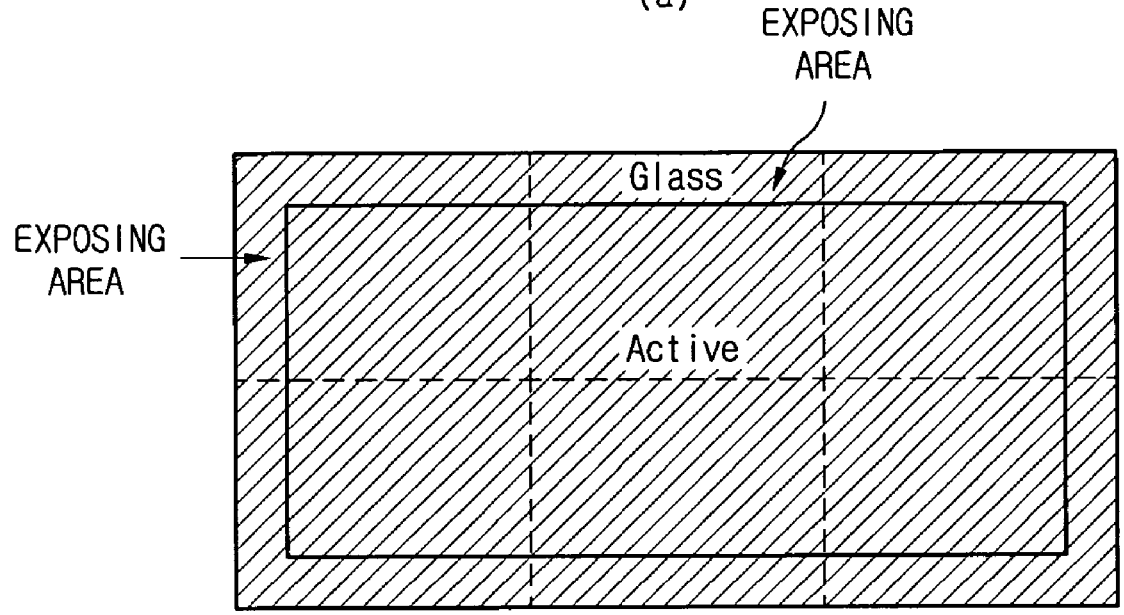
Figure 2:
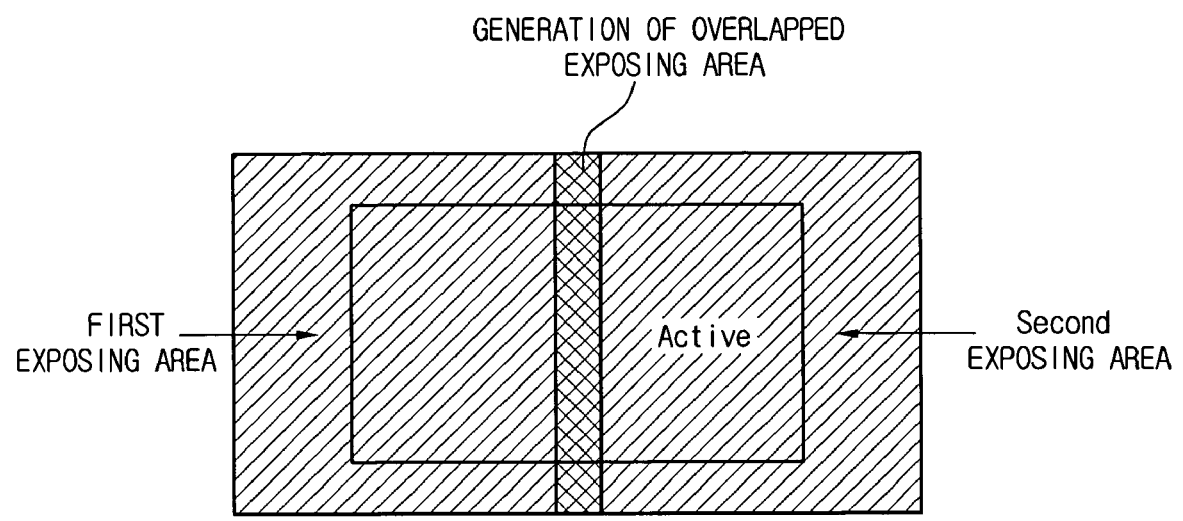
FIG. 2 shows overlapped exposing areas as a result of an overlapping partitioned exposure process.
Figure 3:
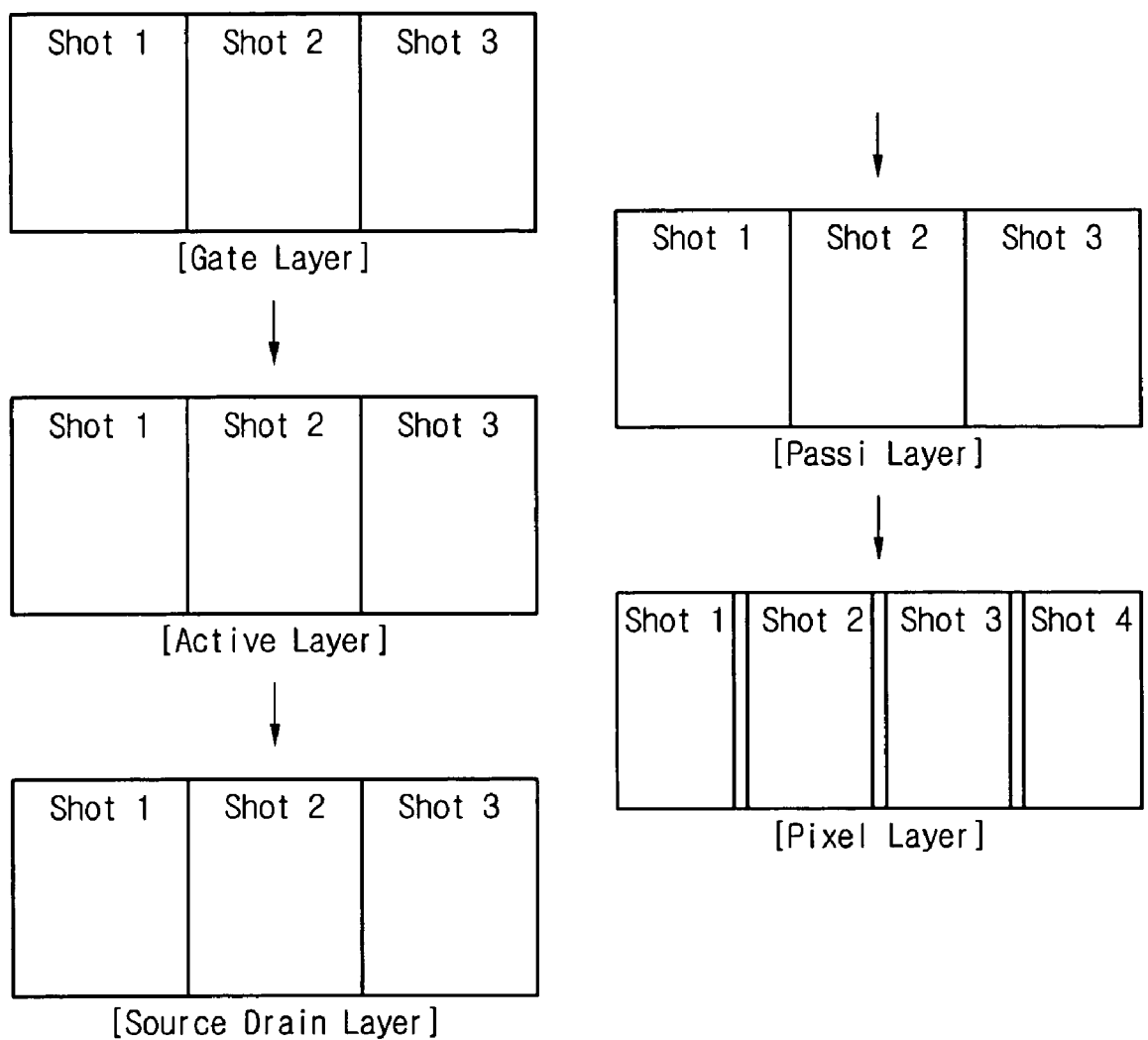
FIG. 3 shows an exposure process of a liquid crystal display device manufacturing process according to a related art.
Figure 4:
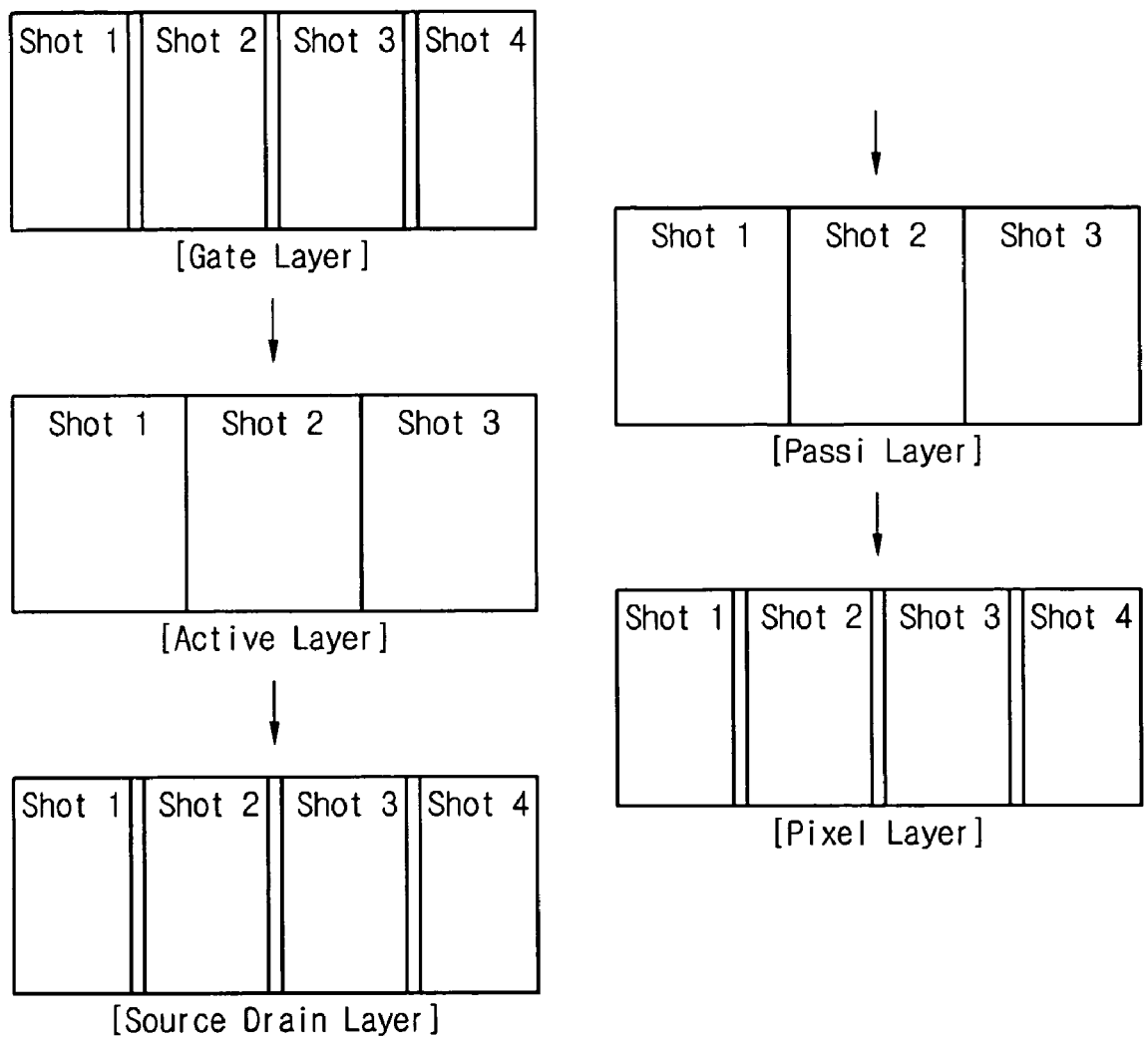
FIG. 4 shows an exposure process performed in a method of manufacturing a liquid crystal display device according to one embodiment.

FIG. 4 shows an exposure process of a method of manufacturing a liquid crystal display device. As shown in FIG. 4, an overlapping partitioned exposure process (LEGO) is performed to form four partitioned exposing areas in a mask process of forming a gate layer and a gate line.

A partitioned exposure process is performed to form three partitioned exposing areas in a mask process of forming an active layer by depositing an active layer material on a plate where a gate line is formed. In the mask process of forming the active layer, the number of partitioned exposure shots is reduced to three and does not overlap among the partitioned exposing areas, unlike the mask process of forming the gate line.

After forming the active layer, a mask process of forming a source/drain layer is performed to form a source/drain electrode. A metal layer is deposited on the active layer plate. An exposing area is divided to four partitioned exposing areas and an overlapping partitioned exposure process is performed to produce overlapping areas between the neighboring partitioned exposing areas. The number of the exposure shots is four and the four partitioned exposing areas overlap with each others in the boundary between neighboring partitioned exposing areas.

After forming the source/drain electrode, a mask process of forming a passivation layer is performed by depositing the passivation layer. An exposing area is divided to three partitioned exposing areas and a partitioned exposure process is performed for each of the three partitioned exposing areas. No overlapped area is produced during this process.

After forming the passivation layer, a mask process of forming a pixel layer is performed by forming a pixel electrode. An exposing area is divided to four partitioned exposing areas and an overlapping partitioned exposure process is performed to overlap the four partitioned exposing areas.

Figure 5:
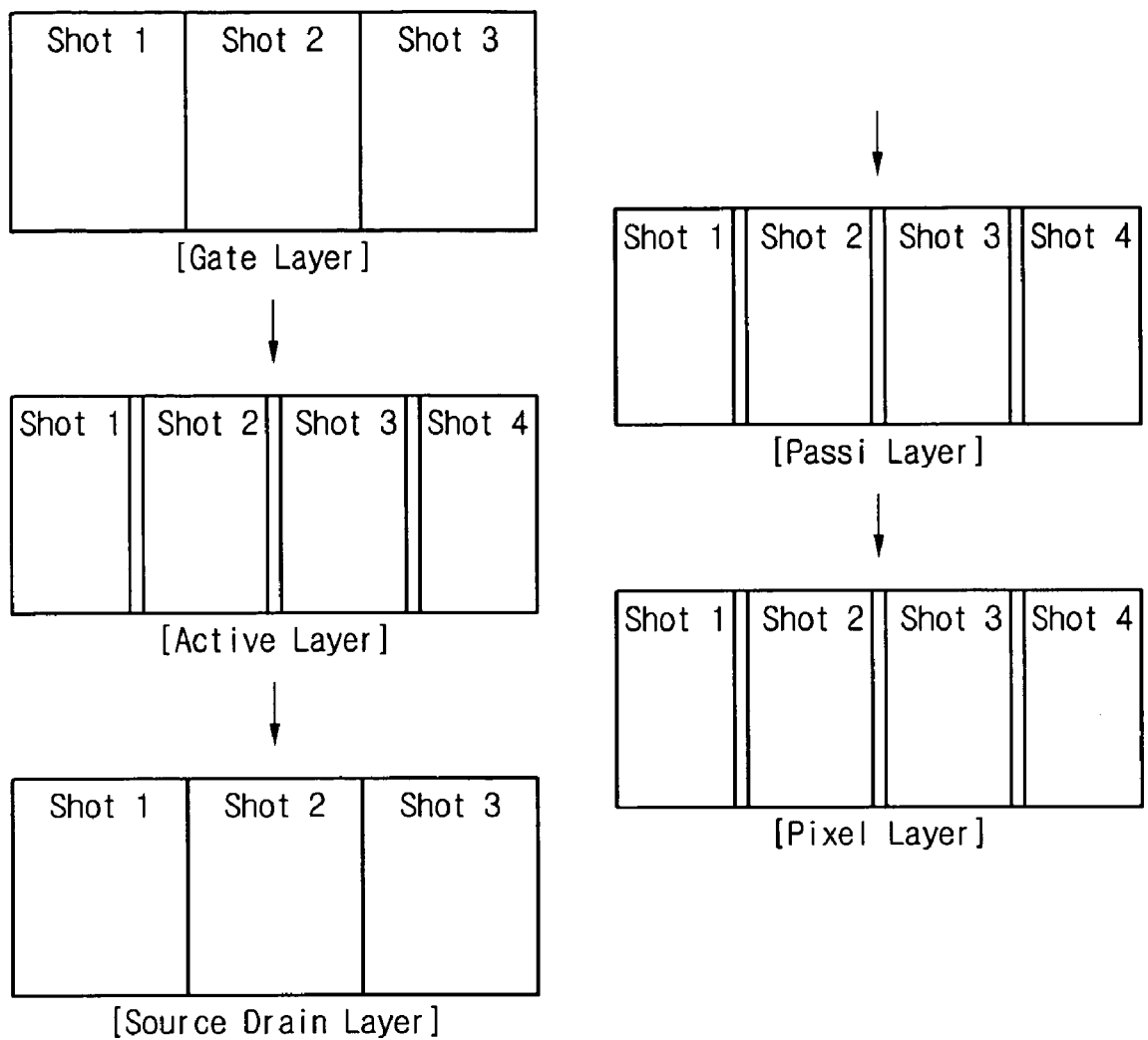
FIG. 5 shows an exposure process performed in a method of manufacturing a liquid crystal display device according to another embodiment.

FIG. 5 shows an exposure process of another embodiment. Unlike the embodiment of FIG. 4, a partitioned exposure process is performed during formation of three partitioned exposing areas in a mask process of forming a gate layer and a mask process of forming a source/drain layer. In the mask process of forming the gate layer, a gate line is formed and in the mask process of forming the source/drain layer, source and drain lines are formed.

An overlapping partitioned exposure process is performed to form four overlapped partitioned exposing areas in a mask process of forming an active layer and a mask process of forming a passivation layer. The mask process is configured to form a contact hole on the passivation layer. Subsequently, the overlapping partitioned exposure process is performed to form four overlapped partitioned exposing areas in a mask process of forming a pixel layer.

As described above, the overlapping partitioned exposure process is performed only in the mask process of forming the pixel electrode according to the related art. In the embodiments of FIG. 4 and FIG. 5, the overlapping partitioned exposure process selectively applies to one or two of the gate line forming process, the active layer forming process, the source/drain electrode forming process and the contact hole forming process.

In these embodiments, the pattern difference between a layer where the overlapping partitioned exposure process is performed and a layer where the partitioned exposure process is performed may be minimized with a selective application of the overlapping partitioned exposure process in a manufacturing process of a liquid crystal display device. The overlapping partitioned exposure process may not be limited to the process of forming the pixel electrode. As a result, a stitch inferiority caused by a large pattern difference may be prevented.

In the embodiment of FIG. 4, the overlapping partitioned exposure process applies to form four overlapped partitioned exposing areas in the gate line forming process, the source/drain electrode forming process and the pixel electrode forming process. In the embodiment of FIG. 5, the overlapping partitioned exposure process is used to form four overlapped partitioned exposing areas in the active layer forming process, the contact hole forming process and the pixel electrode forming process.

Alternatively, or additionally, a liquid crystal display device may be manufactured by using the overlapping partitioned exposure process in one of the gate line forming process, the active layer forming process, the source/drain electrode forming process and the contact hole forming process and by using the overlapping partitioned exposure process in the pixel electrode forming process. Furthermore, a liquid crystal display device may be manufactured by using the overlapping partitioned exposure process in selecting two or more processes among the gate line forming process, the active layer forming process, the source/drain electrode forming process and the contact hole forming process.

The overlapping partitioned exposure process may be selectively applied to a certain number of mask processes to optimize a tact time. A pattern is formed on a first layer by using a pattern width difference generated when a pattern is formed based on the partitioned exposure process or the overlapping partitioned exposure process. The partitioned exposure process or the overlapping partitioned exposure process is selectively applied to form a pattern on a second layer in order to obtain the pattern margin in light of the pattern formed on the first layer.

For example, where it is more important to obtain a margin between the patterns than an operating tact time, the overlapping partitioned exposure process may be used for all mask process of manufacturing a liquid crystal display device.

In FIGS. 4 and 5, the overlapping partitioned exposure process is performed on four partitioned exposure areas and the partitioned exposure process is performed on three partitioned exposure areas. The overlapping partitioned exposure process may be available to various numbers of partitioned areas such as two partitioned areas. As described above, the non-uniformity of patterns between layers may be substantially minimized by selectively performing the overlapping partitioned exposure process. The overlapping partitioned exposure process applies to not only a mask process of forming the pixel electrode but also other mask processes in the manufacturing process of the liquid crystal display device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of manufacturing a liquid crystal display device, the method comprising:
    performing an overlapping partitioned exposure by dividing a gate exposing area to N partitioned areas in a mask process of forming a gate line;
    applying a partitioned exposure to M active layer exposing areas in a mask process of depositing an active layer material on a gate line formed plate;
    progressing the overlapping partitioned exposure by dividing a source/drain exposing area to N partitioned areas in a mask process of forming a source/drain electrode after depositing a metal layer on an active layer formed plate;
    applying the partitioned exposure to M passivation layer exposing areas in a mask process of depositing a passivation layer after forming the source/drain electrode and forming a contact hole in the passivation layer; and
    performing the overlapping partitioned exposure by dividing a pixel exposing area to N partitioned areas in a mask process of forming a pixel electrode on a contact hole formed passivation layer,
    wherein applying the partitioned exposure to the M active layer exposing areas and the M passivation layer comprises producing no overlap partitioned exposing areas.

2. The method according to claim 1, wherein N is bigger than M (N>M).

3. The method according to claim 1, wherein N is 4 and M is 3.

4. The method according to claim 1, wherein performing the overlapping partitioned exposure comprises forming an overlapped area between neighboring partitioned areas for a pattern margin.

5. A method of manufacturing a liquid crystal display device, the method comprising:
    applying a partitioned exposure process to a plurality of first partitioned exposure areas respectively;
    generating no overlap area between the first partitioned exposure areas; and
    applying a overlapping partitioned exposure process to a second plurality of second partitioned exposure areas respectively wherein an overlap area is produced by an overlapping between the second partitioned exposure areas adjacent to each other; and wherein the first partitioned exposure areas is equal to or greater than the second partitioned exposure areas, wherein applying the overlapping partitioned exposure process comprises applying the second exposure process to an active layer mask process for forming an active layer, a passivation layer mask process for forming a contact hole in a passivation layer and a pixel electrode mask process for forming a pixel electrode.

6. The method according to claim 5, further comprising applying the partitioned exposure process and the overlapping partitioned exposure process in an alternate sequence.

* * * * *